United States Patent
Lee et al.

[11] Patent Number: 5,959,350
[45] Date of Patent: Sep. 28, 1999

[54] FIXING DEVICE FOR SECURING A HEAT SINK TO A CPU MODULE

[75] Inventors: Ken Lee, Chung-Ho; Richard Lee; Stanley Chen, both of Taipei, all of Taiwan

[73] Assignee: Hon Hai Precision Ind. Co., Ltd., Taipei Hsien, Taiwan

[21] Appl. No.: 09/083,863

[22] Filed: May 21, 1998

[30] Foreign Application Priority Data

May 21, 1997 [TW] Taiwan .................................. 86208386

[51] Int. Cl.[6] .............................. H01L 23/34; H05K 9/00
[52] U.S. Cl. ........................ 257/712; 257/718; 257/726; 257/727; 257/713
[58] Field of Search ..................... 257/712, 718, 257/722, 726, 727, 719, 720; 361/818

[56] References Cited

U.S. PATENT DOCUMENTS

| | | | |
|---|---|---|---|
| 3,786,317 | 1/1974 | Thierfelder | 257/718 |
| 5,276,585 | 1/1994 | Smithers | 257/712 |
| 5,357,404 | 10/1994 | Bright et al. | 257/718 |
| 5,396,402 | 3/1995 | Perugini et al. | 257/718 |
| 5,521,439 | 5/1996 | Casati et al. | 257/718 |
| 5,621,244 | 4/1997 | Lin | 257/713 |
| 5,638,258 | 6/1997 | Lin | 257/727 |
| 5,684,676 | 11/1997 | Lin | 257/718 |
| 5,740,017 | 4/1998 | Horng | 257/712 |
| 5,748,446 | 5/1998 | Feightner et al. | 257/718 |
| 5,784,257 | 7/1998 | Tata | 257/713 |
| 5,804,875 | 9/1998 | Remsburg et al. | 257/718 |
| 5,831,829 | 11/1998 | Lin | 257/718 |
| 5,870,288 | 2/1999 | Chen | 257/712 |

*Primary Examiner*—Mahshid Saadat
*Assistant Examiner*—Jhihan B Clark

[57] ABSTRACT

A fixing device for securing a heat sink to a CPU module includes a base plate, two elastic side plates respectively extending from two distal ends of the base plate, two curved portions formed between the base plate and the two elastic side plates for increasing elasticity of the fixing device when the two elastic side plates are expanded outward with respect to a central axis therebetween, two hooks respectively formed at free ends of the elastic side plates for securing to a backplane of the CPU module thereby sandwiching the heat sink between the fixing device and the CPU module, and two is engagement tabs respectively formed on the elastic side plates for allowance of an external tool to release the fixing device from the CPU module.

6 Claims, 4 Drawing Sheets

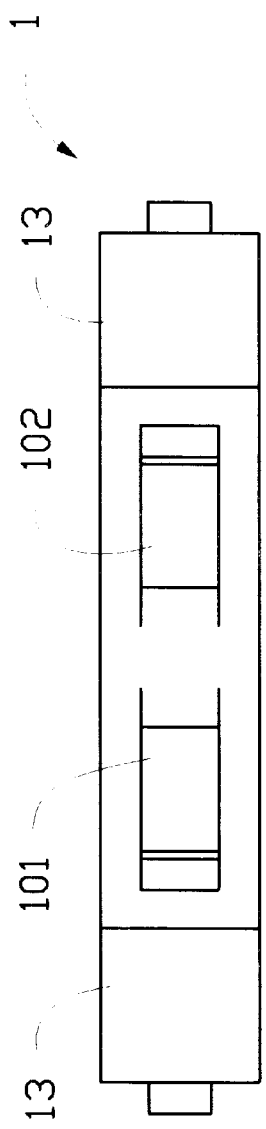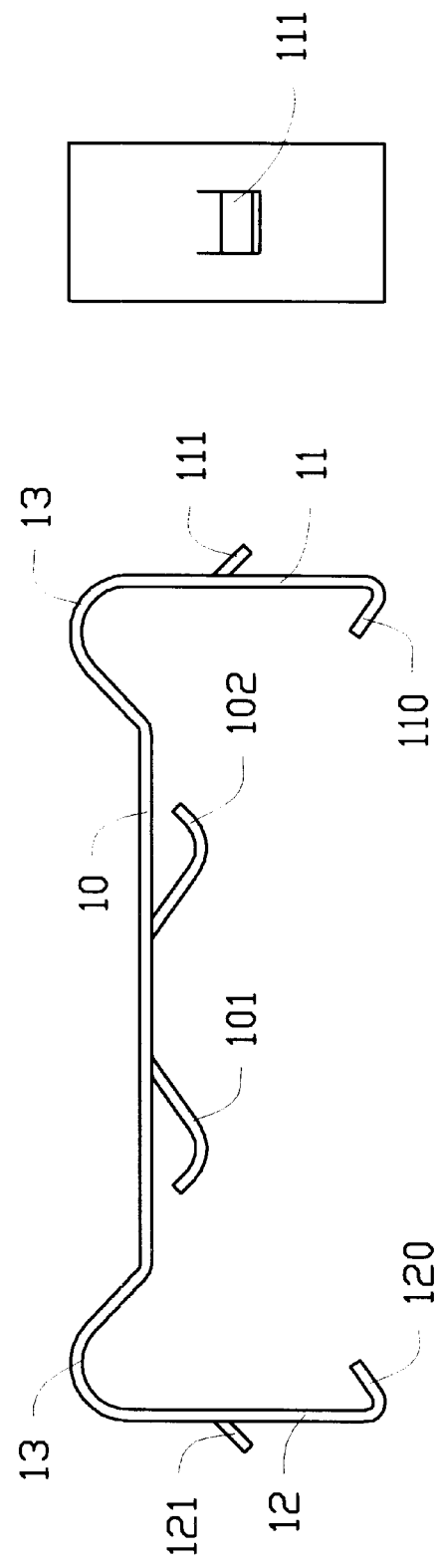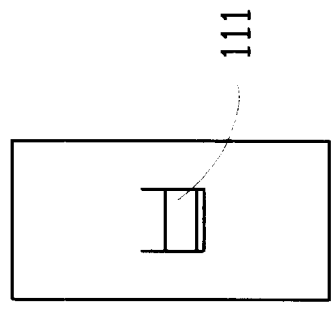

FIXING DEVICE FOR SECURING A HEAT SINK TO A CPU MODULE

BACKGROUND OF THE INVENTION

1. Field of the Invention

The present invention relates to a fixing device for securing a heat sink to a CPU module, especially one which has relatively simple structure for easily and removably securing heat sink to a CPU module.

2. The Prior Art

A mother board of a personal computer has many components mounted thereon. Most of these components generate heat during operation, therefore, a fan is usually installed on the mother board for dissipating heat.

Since modularization has become a trend in the PC industry, a CPU is often configured with other components in a module box, therefore, a CPU module of this combination further requires a specific heat sink to dissipate heat in addition to the fan. Based on this requirement, a fixing device for securing the heat sink to the CPU module is earnestly required.

SUMMARY OF THE INVENTION

The primary purpose of the present invention is to provide a fixing device for easily securing a heat sink to a CPU module.

An alternative purpose of the present invention is to provide a fixing device which can be easily released from a securing combination of a heat sink and a CPU module.

In accordance with one aspect of the present invention, a fixing device for securing a heat sink to a CPU module comprises a base plate, two elastic side plates respectively extending from two distal ends of the base plate, two curved portions formed between the base plate and the two elastic side plates for increasing elasticity of the fixing device when the two elastic side plates are expanded outward with respect to a central axis therebetween, two hooks respectively formed at free ends of the elastic side plates for securing to a backplane of the CPU module thereby sandwiching the heat sink between the fixing device and the CPU module, and two disengagement tabs respectively formed on the elastic side plates for allowance of an external tool to release the fixing device from the CPU module.

In accordance with another aspect of the present invention, a fixing device for securing a heat sink to a CPU module comprises a base plate, two elastic side plates respectively extending from two distal ends of the base plate, two curved portions formed between the base plate and the two elastic side plates for increasing elasticity of the fixing device when the two elastic side plates are expanded outward with respect to a central axis therebetween, two hooks respectively formed at free ends of the elastic side plates for securing to a backplane of the CPU module thereby sandwiching the heat sink between the fixing device and the CPU module, and two disengagement holes respectively defined in the elastic side plates for allowance of an external tool to release the fixing device from the CPU module.

BRIEF DESCRIPTION OF THE DRAWINGS

FIG. 2A is a front view of the fixing device in accordance with the present invention;

FIG. 2B is a bottom view of the fixing device in accordance with the present invention;

FIG. 2C is a side view of the fixing device in accordance with the present invention;

DETAILED DESCRIPTION OF THE PREFERRED EMBODIMENTS

Figure 1:
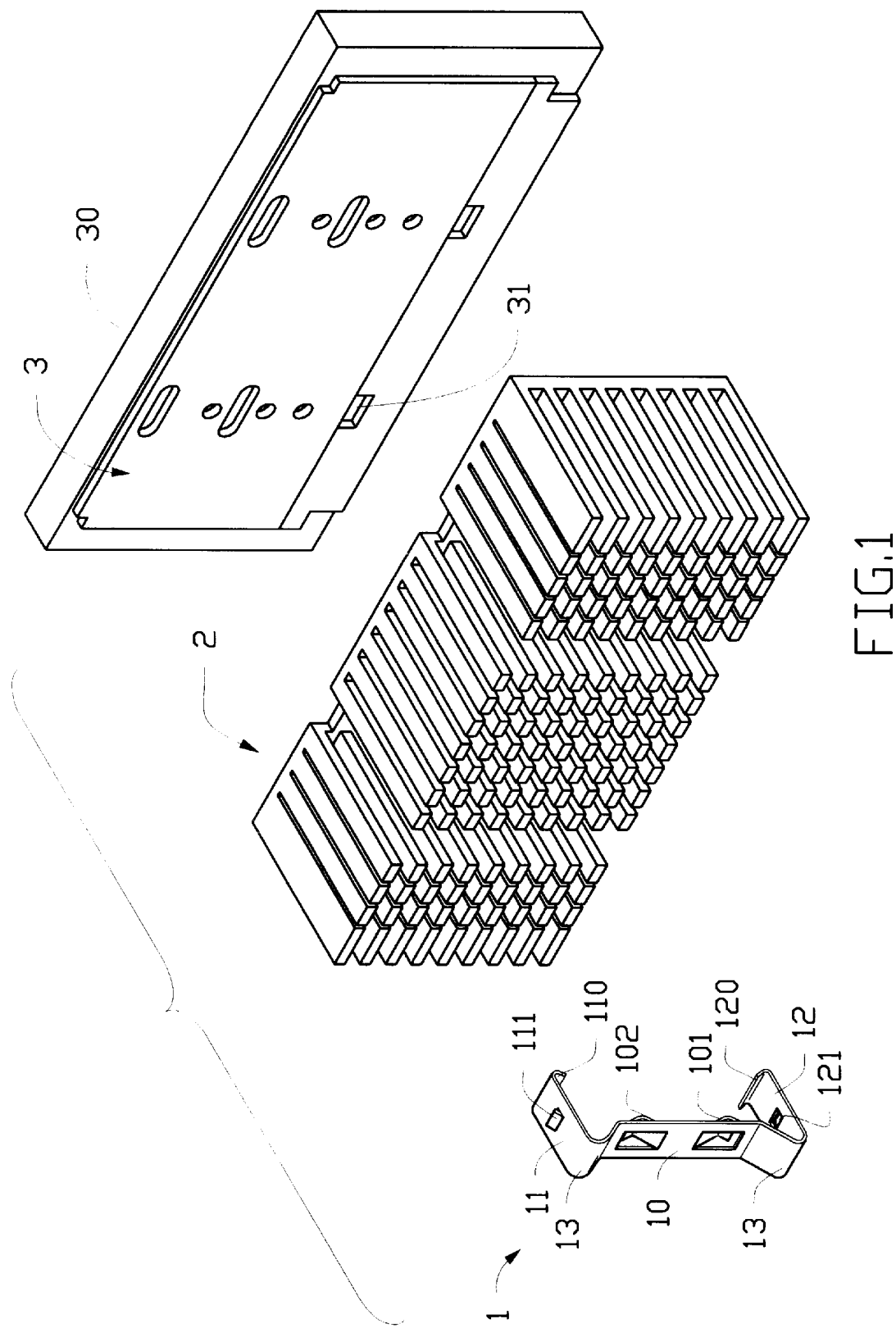
FIG. 1 is an unassembled perspective view showing a CPU module, a heat sink, and a fixing device in accordance with a first embodiment of the present invention.
Figure 3:
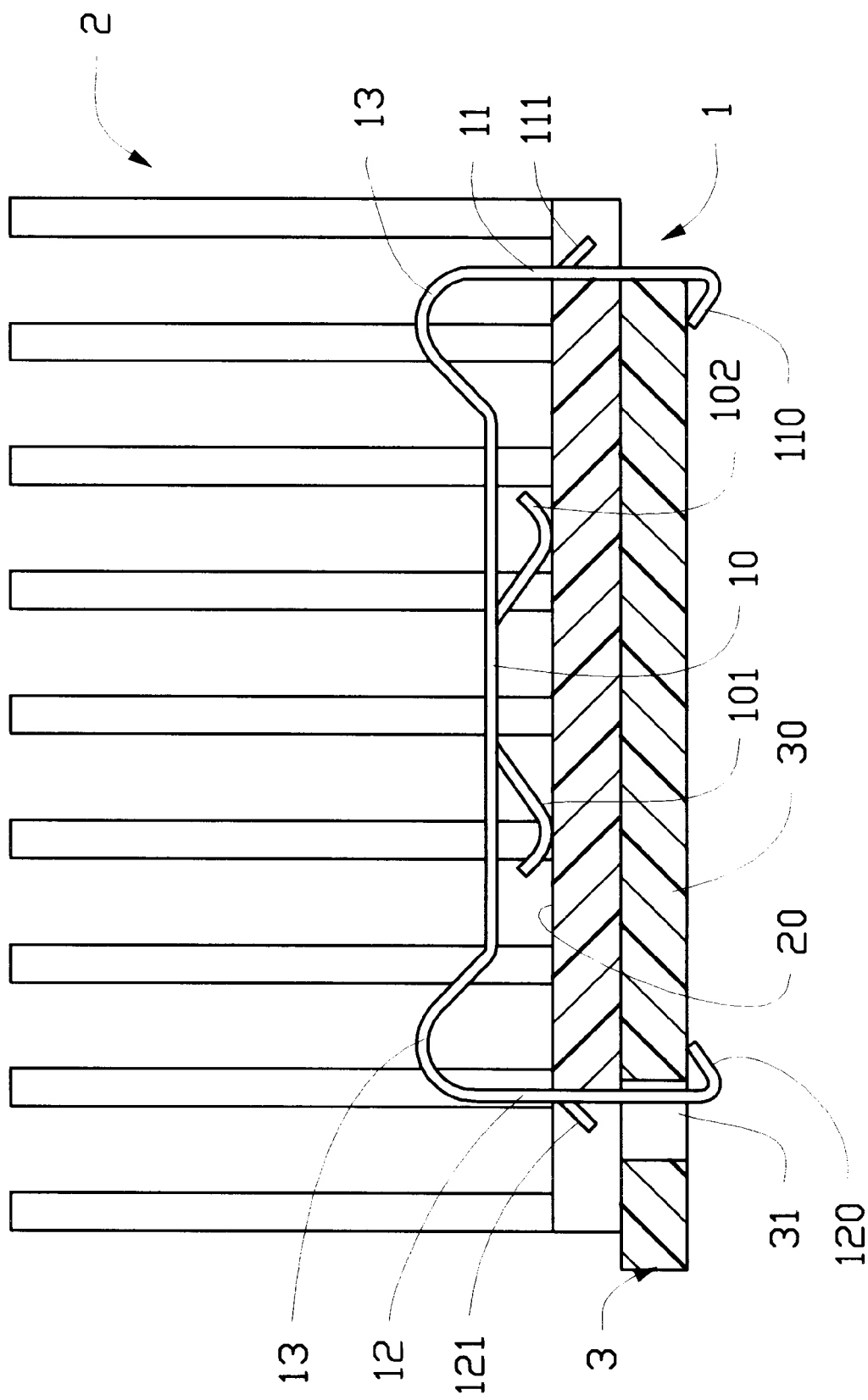
FIG. 3 is a cross-sectional view showing how the fixing device secures the heat sink to the CPU module.

Referring to FIGS. 1, 2 and 3, a fixing device 1 in accordance with a first embodiment of the present invention is a metal plate formed by punching and bending for securing a heat sink 2 to a CPU module 3. The fixing device 1 comprises a base plate 10 and two elastic side plates 11, 12 respectively extending from two distal ends of the base plate 10, wherein a curved portion 13 is formed between the base plate 10 and each elastic side plates 11, 12 for increasing elasticity of the fixing device 1 when the two elastic side plates 11, 12 are expanded outward with respect to a central axis therebetween. Two hooks 110, 120 are respectively formed at free ends of the elastic side plates 11, 12 for securing to a backplane 30 of the CPU module 3 thereby sandwiching the heat sink 2 between the fixing device 1 and the CPU module 3. Two disengagement tabs 111, 121 are respectively formed on the elastic side plates 11, 12 for allowance of an external tool such as a screwdriver to operate thereon for releasing the fixing device 1 from the CPU module 3.

For further engagement of the heat sink 2 to the CPU module 3, two elastic tabs 101, 102 projecting from the base plate 10 of the fixing device 1 abut against a bottom surface 20 of the heat sink 2. With the elastic tabs 101, 102 abutting against the bottom surface 20 of the heat sink 2 and the hooks 110, 120 abutting against the backplane 30 of the CPU module 3, the heat sink 2 can be partially but well sandwiched between the fixing device 1 and the CPU module 3 by two opposite forces respectively coming from the fixing device 1 and the CPU module 3. More specifically, when the fixing device 1 is fixed to the CPU module 3, the elastic side plate 12 penetrates through a hole 31 defined in the CPU module 3 and the other elastic side plate 11 abuts an edge of the CPU module 3, and the hooks 110, 120 abut against the backplane 30 of the CPU module 3. The engagement between the fixing device 1, the heat sink 2, and the CPU module 3 can be released by firstly operating an external tool such as a screwdriver on the disengagement tab 111 to release engagement between the elastic side plate 11 and the CPU module 3. The engagement between the elastic side plate 12 and the CPU module 3 can then be released in the same way. The elastic tabs 101, 102 are deformed when the fixing device 1 is released from the engagement with the CPU module 3.

Figure 4:
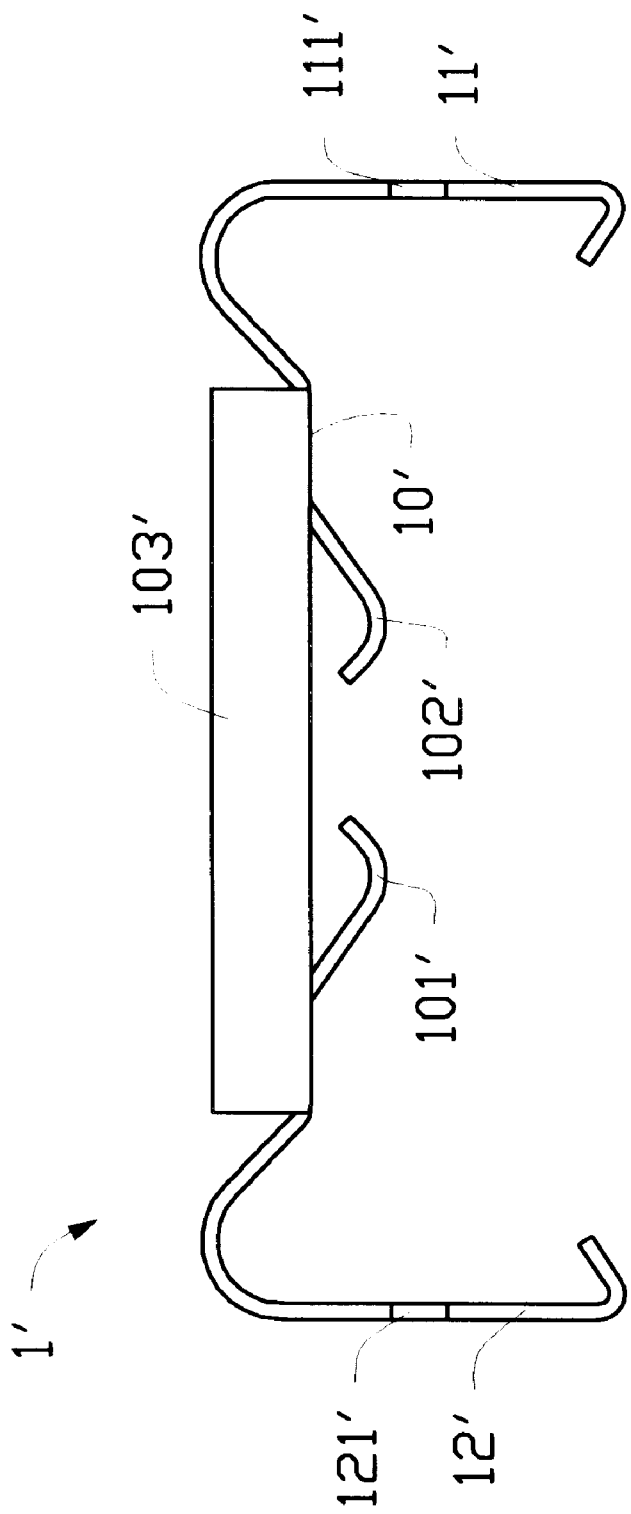
FIG. 4 is a second embodiment of the fixing device in accordance with the present invention.

A second embodiment of the present invention is shown in FIG. 4. A fixing device 1' is similar to the fixing device 1 of the first embodiment except that a base 10 thereof further comprises two reinforcement walls 103' extending upright from two sides thereof for strengthening the abutment of the base 10' to the bottom surface 20 of the heat sink 2. The two elastic tabs 101, 102 as disclosed in the first embodiment are replaced with two elastic tabs 101', 102'. The difference therebetween is that the free ends of the two elastic tabs 101, 102 extend outward with respect to a central axis therebetween while the free ends of the two elastic tabs 101', 102' extend inward with respect to a central axis therebetween resulting from a different punching orientation from the base 10, 10' thereof. The free ends of the two elastic tabs 101', 102' are also curved in order to smoothly contact the bottom surface 20 of the heat sink 2 during assembly. Two disengagement holes 111', 121' are defined in the elastic side plates 11', 12' which replace the disengagement tabs 111, 112 for allowing an external tool such as a screwdriver to operate thereon for releasing the engagement between the fixing device 1' and the CPU module 3. Similar to the first embodiment, the two elastic tabs 101', 102' are deformed during release of the fixing device 1' from engagement with the CPU module 3.

While the present invention has been described with reference to specific embodiments, the description is illustrative of the invention and is not to be construed as limiting the invention.

Therefore, various modifications to the present invention can be made to the preferred embodiments by those skilled in the art without departing from the true spirit and scope of the invention as defined by the appended claims.

What is claimed is:

1. A fixing device for securing a heat sink to a CPU module, the fixing device comprising a base plate, two elastic side plates respectively extending from two distal ends of the base plate, two curved portions formed between the base plate and the two elastic side plates for increasing elasticity of the fixing device when the two elastic side plates are expanded outward with respect to a central axis therebetween, two hooks respectively formed at free ends of the elastic side plates for securing to a backplane of the CPU module thereby sandwiching the heat sink between the fixing device and the CPU module, and two disengagement tabs respectively formed on the elastic side plates for allowance of an external tool to release the fixing device from the CPU module.

2. The fixing device as claimed in claim 1 further comprising two elastic tabs projecting from the base plate for abutting against a bottom surface of the heat sink whereby the elastic tabs deform during release of the fixing device from the CPU module.

3. The fixing device as claimed in claim 2, wherein each of the elastic tabs has a curved free end for smoothly contacting the bottom surface of the heat sink.

4. A fixing device for securing a heat sink to a CPU module, the fixing device comprising a base plate, two elastic side plates respectively extending from two distal ends of the base plate, two curved portions formed between the base plate and the two elastic side plates for increasing elasticity of the fixing device when the two elastic side plates are expanded outward with respect to a central axis therebetween, two hooks respectively formed at free ends of the elastic side plates for securing to a backplane of the CPU module thereby sandwiching the heat sink between the fixing device and the CPU module, and two disengagement holes respectively defined in the elastic side plates for allowance of an external tool to release the fixing device from the CPU module.

5. The fixing device as claimed in claim 4 further comprising two elastic tabs projecting from the base plate for abutting against a bottom surface of the heat sink whereby the elastic tabs deform during release of the fixing device from the CPU module.

6. The fixing device as claimed in claim 5, wherein each of the elastic tabs has a free end which is curved for smoothly contacting the bottom surface of the heat sink.

\* \* \* \* \*